United States Patent [19]

Taya

[11] Patent Number: 5,075,639
[45] Date of Patent: Dec. 24, 1991

[54] PLURAL PHASE LOCKED LOOP CIRCUIT SUITABLE FOR INTEGRATED CIRCUIT

[75] Inventor: Takashi Taya, Tokyo, Japan
[73] Assignee: Oki Electric Industry Co., Ltd., Tokyo, Japan
[21] Appl. No.: 707,979
[22] Filed: May 23, 1991

Related U.S. Application Data

[63] Continuation of Ser. No. 495,712, Mar. 16, 1990, abandoned.

[30] Foreign Application Priority Data

Mar. 16, 1989 [JP] Japan ................................ 1-64197

[51] Int. Cl.[5] ...................... H03L 7/07; H03L 7/087; H03L 7/099
[52] U.S. Cl. .............................. 331/2; 331/8; 331/17; 331/25; 331/34; 331/113 R; 331/177 R
[58] Field of Search ................. 331/1 A, 2, 8, 11, 17, 331/25, 34, 113 R

[56] References Cited

U.S. PATENT DOCUMENTS

4,131,861 12/1978 Malaviya ................................ 331/2
4,516,084 5/1985 Crowley ................................ 331/2
4,567,448 1/1986 Ikeda ................................ 331/2 X

OTHER PUBLICATIONS

Robert R. Cordell et al., "A 50 MHz Phase— and Frequency-Locked Loop" IEEE Journal of Solid-State Circuits, vol. SC-14, No. 6, pp. 1003-1010, Dec. 1979.

Primary Examiner—Siegfried H. Grimm
Attorney, Agent, or Firm—Wenderoth, Lind & Ponack

[57] ABSTRACT

A PLL circuit suitable for fabrication into an integrated circuit includes: a first phase comparator for determining a phase difference between an input signal and a first feedback signal to produce a first phase difference signal in rsponse to the phase difference; a first loop filter for removing a high frequency constituent from the first phase difference signal; a first variable frequency oscillator which oscillates at a frequency which varies in response to an output of the first loop filter to produce the first feedback signal; a second phase comparator for determining a phase difference between a reference signal and a second feedback signal to produce a second phase difference signal in response to the phase difference; a second loop filter for removing a high frequency constituent from the second phase difference signal; a second variable frequency oscillator having substantially the same characteristics as those of the first variable frequency, oscillator which oscillates at a frequency which varies in response to an output of the second loop filter to produce the second feedback signal, and a signal adder for adding the outputs from the first and second filters and for applying the added signal to the first variable frequency oscillator.

11 Claims, 5 Drawing Sheets

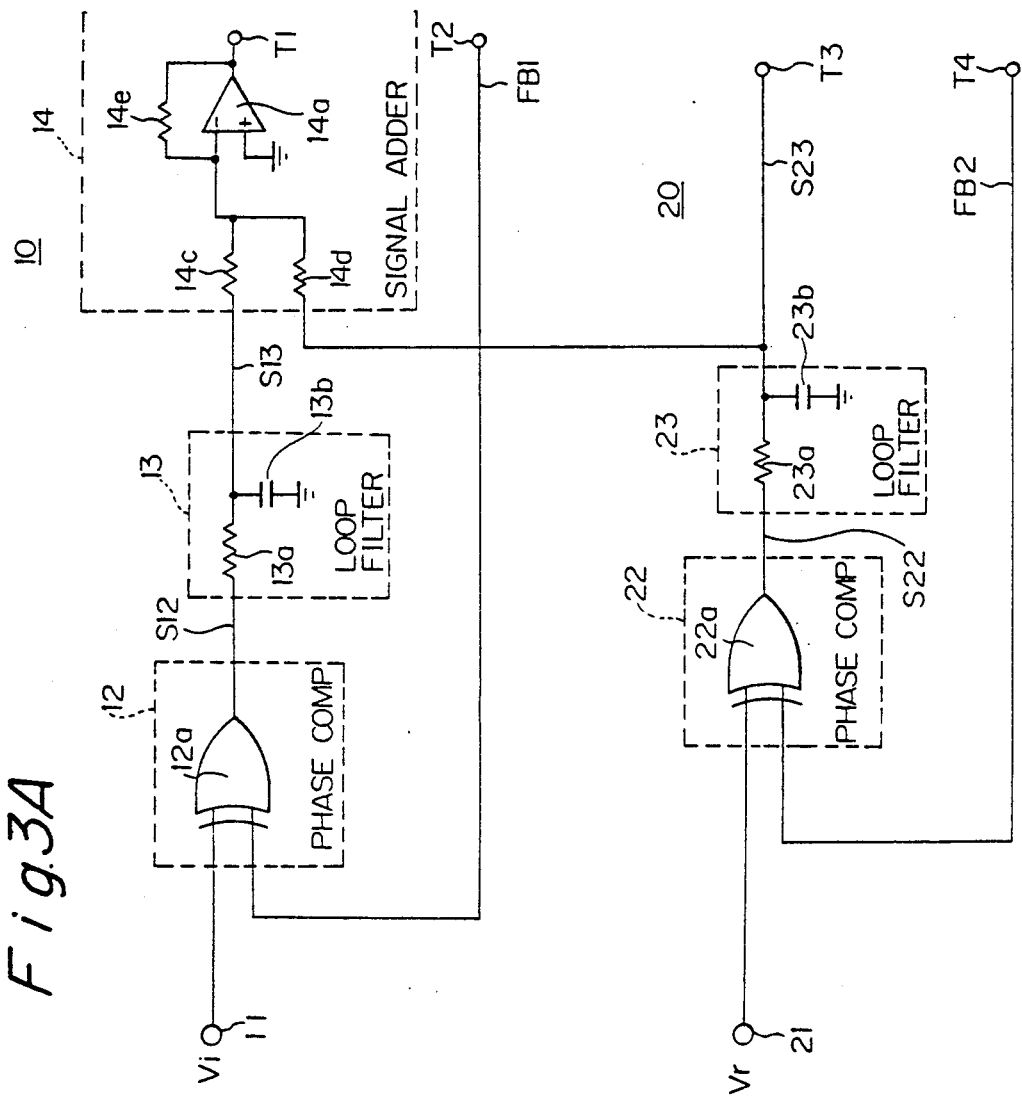

PLURAL PHASE LOCKED LOOP CIRCUIT SUITABLE FOR INTEGRATED CIRCUIT

This application is a continuation of now abandoned application Ser. No. 07/495,712, filed on Mar. 16, 1990.

BACKGROUND OF THE INVENTION

1. Field of the Invention

The present invention generally relates to a PLL (Phase-Locked Loop) circuit used for communication equipment, and more particularly, to a PLL circuit suitable for being implemented as a semiconductor integrated circuit.

2. Description of the Prior Art

The prior art pertinent to the present invention is found in R. Cordell, et al., "A 50 MHz Phase-and Frequency-Locked Loop" IEEE Journal of Solid-State Circuits, SC-14, No. 6, pp. 1003–1010, December 1979 (U.S.A.). A detailed description of the prior art will be given below, making reference to the related drawings.

FIG. 2 shows an example of a conventional PLL circuit. The PLL circuit comprising an integrated circuit has an input terminal 1 for an input signal Vi. The input terminal 1 is connected to a signal adder 4 through a phase comparator 2 and a frequency difference detector 3. The phase comparator 2 is a circuit which transmits a phase difference signal S2 after detecting a phase difference between the input signal Vi and an oscillating signal S6, while the frequency difference detector 3 is a circuit which transmits a frequency difference signal S3 after detecting a frequency difference between the input signal Vi and the oscillating signal S6. Further, the signal adder 4 is a circuit which transmits to a loop filter 5 an added, resultant signal S4 obtained by adding the phase difference signal S2 and the frequency difference signal S3. The loop filter 5 is a circuit which transmits a control signal S5 having a low frequency after removing a high frequency constituent from the added signal S4. The loop filter 5 has an output port connected to a voltage-controlled oscillator 6. The voltage-controlled oscillator 6 is a circuit which transmits the oscillating signal S6 having an oscillating frequency which varies in response to the control signal S5. The phase comparator 2 and the frequency difference detector 3 are connected to the output terminal of the voltage-controlled oscillator.

A phase-locked loop R comprising the phase comparator 2, the signal adder 4, the loop filter 5, and the voltage-controlled oscillator 6 has a capture range (a frequency range for the input signal Vi which is captured by the phase synchronous loop R) ΔF which is determined according to a type of each circuit configuration or a time constant of the loop filter 5.

The operations of the PLL circuit are described below.

To begin with, a level of the phase difference signal S2 is zero and the voltage-controlled oscillator 6 oscillates with its specific oscillating frequency (a free-running frequency) when the input signal Vi has not been fed to the PLL circuit. Supposing that the frequency of the input signal Vi is out of the capture range ΔF, the frequency difference detector 3 outputs the frequency difference signal S3. As the frequency difference signal S3 is fed to the voltage-controlled oscillator 6 in the form of the control signal S5 through the signal adder 4 and the loop filter 5, the oscillating frequency generated from the voltage-controlled oscillator 6 becomes close to the frequency of the input signal Vi. Then, the frequency difference detector 3 stops transmitting the frequency difference signal S3, and on the contrary, the phase difference signal S2 is produced from the phase comparator 2. The phase difference signal S2 is fed to the voltage-controlled oscillator 6 in the form of the control signal S5 through the signal adder 4 and the loop filter 5 so that the phase of the output signal Vo of the voltage-controlled oscillator 6 can be locked to the phase of the input signal Vi.

The PLL circuit shown in FIG. 2 is generally used for extracting a clock signal and has a function for extracting only a desired frequency constituent from the input signal Vi including noise.

When the PLL circuit is used as a noise filter, for example, it is necessary to take a noise bandwidth into consideration. The noise bandwidth is generally a frequency bandwidth which extends to only 3 dB from the maximum attenuation rate in terms of the relationship between frequency and attenuation rate. In order to highten the function of the PLL circuit as a noise filter, it is necessary to set the noise bandwidth narrow by increasing a time constant of the loop filter 5. If this is done so, however, a capture range determined by the time constant of the loop filter 5 also becomes narrow.

FIG. 2 shows an ordinary PLL circuit consisting of only a phase synchronous loop R, in which the frequency difference detector 3 is provided for widening the capture range so that the PLL circuit can receive the input signal Vi having a frequency range as wide as the widened capture range.

Even in the PLL circuit having the above-mentioned configuration, however, the capture range can be widened only a few percent. In order to operate the PLL circuit, it is necessary to set the free-running frequency of the voltage-controlled oscillator 6 within the capture range, and therefore, further improvement in accuracy of the voltage-controlled oscillator is necessary. Consequently, it was impossible to constitute the voltage-controlled oscillator 6 by incorporating only a simply structured and inexpensive voltage-controlled oscillating circuit suitable for an integrated circuit, and it was necessary to incorporate circuit elements, such as inductors, capacitors, etc., as external components. This caused an increase in the quantity of elements used in a circuit and the space required for setting up a circuit, resulting in a hindrance in the speed-up of operations as well as an increase in cost.

SUMMARY OF THE INVENTION

It is, therefore, an object of the present invention to provide a PLL circuit which uses fewer elements comprising the circuit and less space for establishing the circuit, and realizes a speed-up of operations and a reduction of cost.

In accordance with the present invention, a PLL circuit comprises a first phase comparator for determining a phase difference between an input signal and a first feedback signal to produce a first phase difference signal according to the phase difference; a first loop filter for removing a high frequency constituent from the first phase difference signal; a first variable frequency oscillator which oscillates at a frequency which varies in response to an output of the first loop filter to produce the first feedback signal; a second phase comparator for determining a phase difference between a reference signal and a second feedback signal to produce a second phase difference signal; a second loop filter for removing a high frequency constituent from the second phase difference signal; a second variable frequency oscillator having substantially the same characteristics as those of the first variable frequency oscillator which oscillates at a frequency which varies in response to an output of the second loop filter to produce the second feedback signal, and a signal adding circuit for adding the outputs of the first and second loop filters and for applying the added signal to the first variable frequency oscillator.

Furthermore, in accordance with the present invention, a PLL circuit is provided with a plurality of phase-locked loops by incorporating variable frequency oscillators having the same characteristic so that an output signal of the loop filter originated from one phase-locked loop can be used for controlling another phase-locked loop. This makes it possible to use a variable frequency oscillator suitable for establishing an integrated circuit requiring fewer components. Consequently, a PLL circuit can be constructed with a single integrated circuit chip, resulting in the realization of a speed-up of operations, high reliability and a reduction of cost due to the simplification of the circuit configuration.

Still furthermore, in accordance with the present invention, the PLL circuit is capable of setting a reference frequency in a wide range, since the reference frequency can be set at a frequency level according to the division ratio of a divider.

BRIEF DESCRIPTION OF THE DRAWINGS

The objects and features of the present invention will become more apparent from the consideration of the following detailed description taken in conjunction with the accompanying drawings in which:

FIGS. 3A and 3B together form a circuit diagram representative of a specific configuration of the PLL circuit shown in FIG. 1.

DESCRIPTION OF THE PREFERRED EMBODIMENTS

Figure 1:
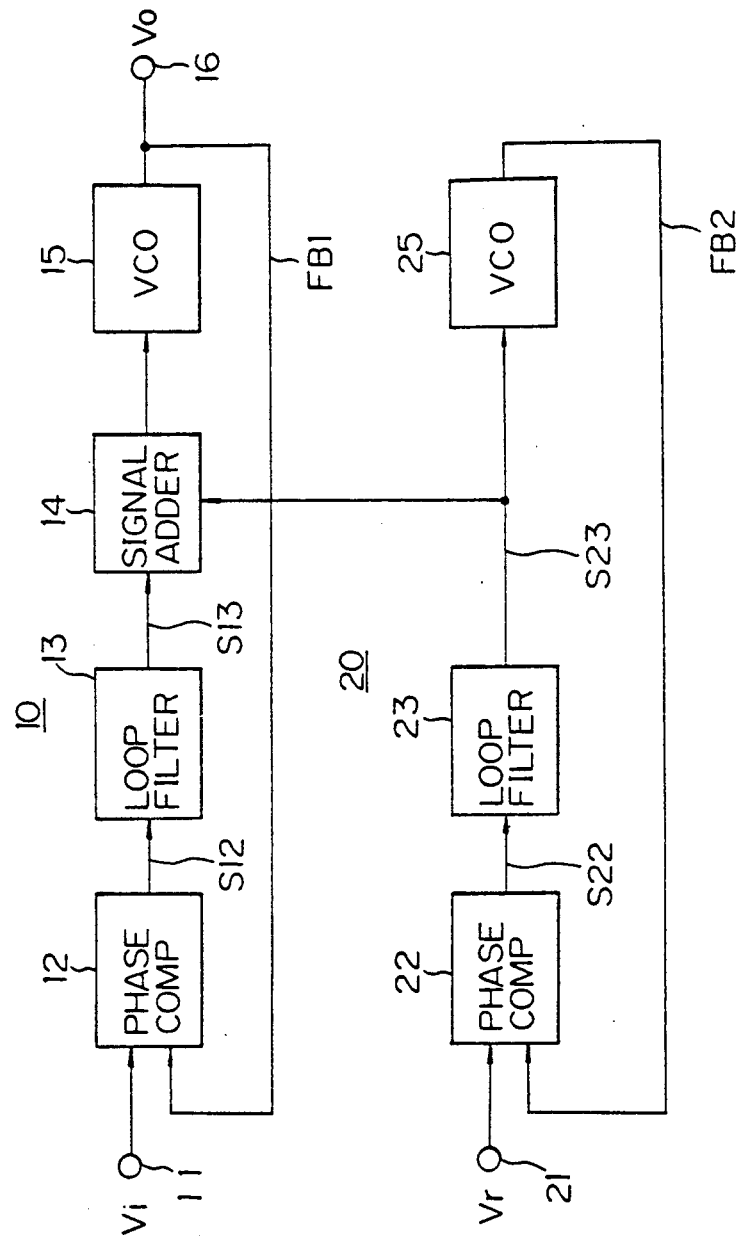
FIG. 1 is a schematic block diagram showing a configuration of an illustrative embodiment of a PLL circuit in accordance with the present invention.
Figure 2:
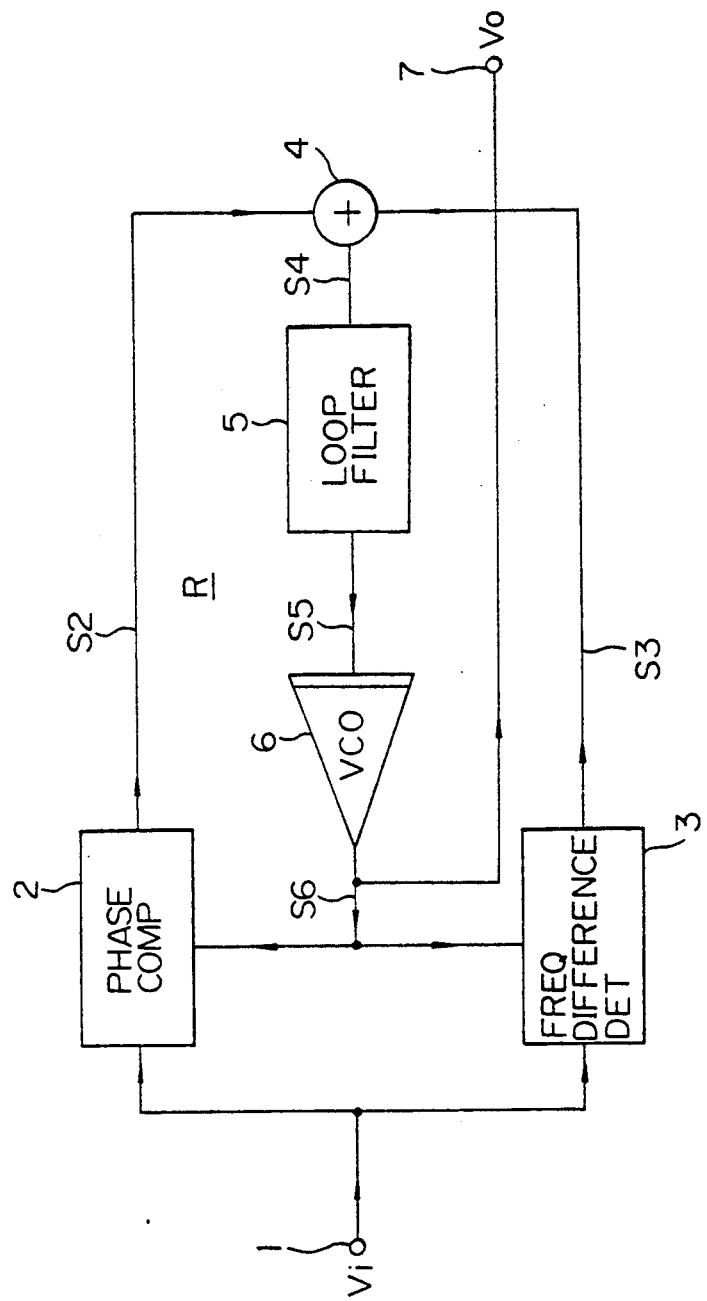
FIG. 2 is a schematic block diagram of a configuration of a PLL circuit of the prior art.

Referring to FIG. 1, there is shown a PLL circuit having first and second phase-locked loops 10 and 20 that, for example, form a semiconductor integrated circuit. The first phase-locked loop 10 has an input terminal 11 so that an input signal Vi from the input terminal 11 and a first feedback signal FB1 may be input into a phase comparator 12. The phase comparator 12 is a circuit which determines a phase difference between the input signal Vi and the first feedback signal FB1 and transmits a first phase difference signal S12 associated with the phase difference. A loop filter 13 is connected to the output of the phase comparator 12. The loop filter 13 removes a high frequency constituent of the signal output by the phase comparator 12. Furthermore, the loop filter 13 has an output connected to an input of a variable frequency oscillator, such as a voltage-controlled oscillator 15, through a signal adder 14. An output terminal 16 is connected to the output of the voltage-controlled oscillator 15, for outputting an output signal Vo. The output terminal 16 is also connected to another input terminal of the phase comparator 12.

The signal adder 14 is a circuit for adding signal S13 from the loop filter 13 and an output signal S23 from a loop filter 23 included in the second phase-locked loop and for transmitting the added, resultant signal to the voltage-controlled oscillator 15. The voltage-controlled oscillator 15 is a circuit for generating the first feedback signal FB1 by oscillating at a frequency which varies in response to an output from the signal adder 14 and for transmitting the first feedback signal FB1 to the output terminal 16 and the phase comparator 12.

Furthermore, the second phase-locked loop 20, which has an input terminal 21 for receiving a reference signal Vr, includes a phase comparator 22 that is responsive to a second feedback signal FB2. The phase comparator 22 is a circuit which, like the phase comparator 12 in the first phase-locked loop 10, determines a phase difference between the reference signal Vr and the second feedback signal FB2 and transmits a second phase difference signal S22 representative of the phase difference. The phase comparator 22 has an output connected to a loop filter 23. The loop filter 23 is a circuit for removing a high frequency constituent from the second phase difference signal S22 and for transmitting an output signal S23 having a low frequency according to the phase difference or the frequency difference between the reference signal Vr and the second feedback signal FB2. The output S23 of the loop filter 23 is supplied to both the signal adder 14 and to a voltage-controlled oscillator 25.

The voltage-controlled oscillator 25, having the same characteristics with a predetermined accuracy E as those of the voltage-controlled oscillator 15 included in the first phase-locked loop 10, is a circuit used for generating the second feedback signal FB2 by oscillating at a frequency which varies according to the output signal S23 from the loop filter 23 and for feeding the second feedback signal FB2 to the input terminal of the phase comparator 22.

The operation of the PLL circuit is described below.

Firstly, when the reference signal Vr having a certain reference frequency is applied to an input terminal 21, the phase comparator 22 carries out a phase comparison of the reference signal Vr with the second feedback signal FB2 generated from the voltage-controlled oscillator 25 to produce the phase difference signal S22. In the loop filter 23, a high frequency constituent is removed from the phase difference signal S22, and the output signal S23 is input into the voltage-controlled oscillator 25. When the voltage-controlled oscillator 25 transmits the second feedback signal FB2, the frequency and phase of the second feedback signal FB2 become substantially equal to the frequency and phase of the reference signal Vr, and accordingly the phase-locked loop 20 is placed in a locked state.

When the phase-locked loop 20 is locked, when the input signal Vi is applied to the input terminal 11 and if the frequency of the input signal Vi differs significantly from the frequency of the first feedback signal FB1, the phase comparator 12 does not function, and as a result, both levels of the phase difference signal S12 and the output signal S13 go down to zero. In that case, since the output signal S23 from the loop filter 23 is input into the voltage-controlled oscillator 15 as is, the frequency of the first feedback signal FB1 becomes substantially equal to the frequency of the second feedback signal FB2 with the accuracy E. Also, since the frequency of the second feedback signal FB2 is substantially equal to the reference frequency, the frequency of the first feedback signal FB1 becomes substantially equal to the reference frequency with the accuracy E.

Then, when the frequency of the input signal Vi becomes close to the oscillating frequency from the voltage-controlled oscillator 15, the output signal S13 associated with the phase difference is transmitted from the loop filter 13 and applied to the voltage-controlled oscillator 15 through the signal adder 14. As a result, the phase of the output signal Vo in the phase-locked loop 10 becomes equal to the phase of the input signal Vi so that the phase-locked loop 10 is placed in a locked state. In this way, the circuitry shown in FIG. 1 functions as a PLL circuit using the input terminal 11 as an input terminal for receiving a signal to be subject to the phase locking control and the output terminal 16 as an output terminal for transmitting a signal with the phase locked. The free-running frequency is dependent on the reference frequency.

A PLL circuit included in the illustrative embodiment has the following advantages.

(a) A capture range and a noise bandwidth of the second phase-locked loop 20 can be set by configuration of circuits for the phase comparator 22, the loop filter 23, and the voltage-controlled oscillator 25 and constants for circuit elements involved in those circuits (for example, a time constant for the loop filter 23). Consequently, when a time constant for the loop filter 23 is set to be small and the capture range is set to be wide, for example, the phase of the reference signal Vr having a wider frequency range can be locked even if a voltage-controlled oscillator having a large fluctuation in oscillating frequency and low accuracy is used instead of the voltage-controlled oscillator 25.

In general, when a capture range is set to be wide, the accuracy of a PLL circuit working as a filter lowers, since the noise bandwidth is widened. However, it will not cause problems if a frequency having less noise constituents is used for a reference signal Vr.

(b) A capture range and a noise bandwidth of the first phase-locked loop 10 can be set by configuration of circuits for the phase comparator 12, the loop filter 13, and the voltage-controlled oscillator 15 and constants for circuit elements used in those circuits. Consequently, a narrow bandwidth property capable of taking out a particular frequency constituent can be obtained by setting the noise bandwidth to be narrow. Now, when the noise bandwidth of the phase-locked loop 10 is set to be narrow, the capture range of the phase-locked loop 10 becomes narrow, and therefore, there is a possibility that the phase-locked loop 10 will not be able to become locked with the phase of a desired frequency constituent. However, as the oscillating frequency from the voltage-controlled oscillator 15 can be set by a reference frequency, there will be no problem if a reference signal having a frequency within the capture range of the phase-locked loop 10 is fed into the input terminal 21.

Figure 3B:
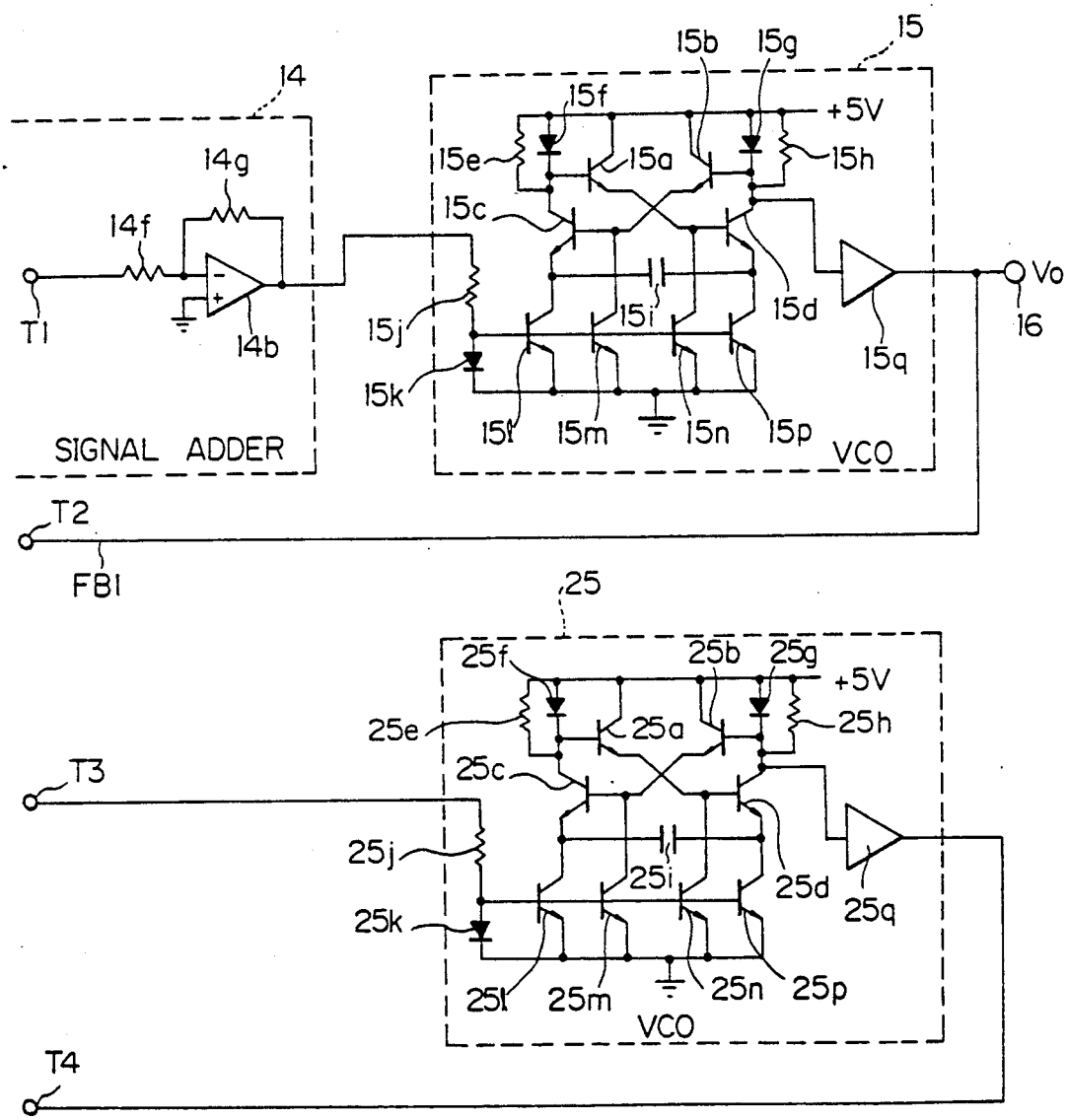

FIGS. 3A and 3B illustrate a specific configuration of the PLL circuit shown in FIG. 1, allotting the same reference numerals to the like components shown in FIG. 1.

The phase comparator 12 comprises an exclusive-OR or EOR gate 12a. The loop filter 13 connected to the output terminal of the EOR gate 12a, comprises a resistor 13a and a capacitor 13b. The signal adder 14 has resistors 14c and 14d connected to the outputs of the loop filters 13 and 23, and also has operational amplifiers 14a and 14b, and resistors 14e, 14f and 14g interconnected as shown on the output side thereof. The voltage-controlled oscillator 15 has a resistor 15j connected to the output terminal of the signal adder 14. The voltage-controlled oscillator 15 is a multi-vibrator type voltage-controlled oscillator which comprises the resistor 15j, npn transistors 15a, 15c and 15d, resistors 15e and 15h, diodes 15f and 15g, a capacitor 15i, npn transistors 15l, 15m, 15n, and 15p for the regulated power supply, a diode 15k, and a buffer amplifier 15q for amplifying outputs. The output terminal 16 for the output signal Vo is connected to the output of the buffer amplifier 15q as well as to the input terminal T2 of the EOR gate 12a constituting the phase comparator 12.

Further, the phase comparator 22 included in the second phase-locked loop 20 comprises an EOR gate 22a, while the loop filter 23 connected to the output side of the phase comparator 22 comprises a resistor 23a and a capacitor 23b. The multi-vibrator type voltage-controlled oscillator 25 has an input resistor 25j connected to the output terminal of the loop filter 23. The voltage-controlled oscillator 25 has substantially the same characteristics as those of the voltage-controlled oscillator 15 with the accuracy E and has npn transistors 25a, 25b, 25c, and 25d, resistors 25e and 25h, diodes 25f and 25g, a capacitor 25i, npn transistors 25l, 25m, 25n and 25p for the regulated power supply, a diode 25k, and a buffer amplifier 25q for amplifying outputs. The output terminal T4 of the buffer amplifier 25q is connected to one input terminal of the EOR gate 22a constituting the phase comparator 22. The PLL circuit operates as described below.

Firstly, when the reference signal Vr having a certain reference frequency is applied to the input terminal 21, the EOR gate 22a constituting the phase comparator 22 compares the phase of the reference signal Vr with the phase of the second feedback signal FB2. When the phases of the reference signal Vr and the second feedback signal FB2 coincide with each other, the phase comparator 22 transmits a phase difference signal S22 having its low voltage level, or otherwise, the phase comparator 22 transmits the phase difference signal S22 having its high voltage level. The phase difference signal S22 is input in the voltage-controlled oscillator 25 through the loop filter 23 in which phase difference signal S22 is converted into the output signal S23. When the output signal S23 is applied to the resistor 25j of the voltage-controlled oscillator 25, the collector current in the npn transistors 25l, 25m, 25n, and 25p changes to cause the capacitor 25i to charge and discharge, resulting in the npn transistors 25c and 25d switching. The voltage-controlled oscillator 25 in turn oscillates to develop the second feedback signal FB2.

When the input signal Vi having a certain frequency is applied to the input terminal 11, the EOR gate 12a of the phase comparator 12 carries out phase comparison between the input signal Vi and the first feedback signal FB1. When the phases of both signals Vi and FB1 coincide with each other, the phase comparator 12 transmits the phase difference signal S12 having its low voltage level, or otherwise, the phase comparator 12 produces the phase signal S12 having its high voltage level. The phase difference signal S12 is fed to the signal adder 14 through the loop filter 13 in which the phase difference signal is converted into the output signal S13. In the signal adder 14, both output voltages from the loop filters 13 and 23 are added by the operational amplifiers 14a and 14b through the resistors 14c and 14d. When the resistor 15j of the voltage-controlled oscillator 15 is supplied with the resultant sum voltage from the adder 14, the voltage-controlled oscillator 15 functions in the same fashion as described above for the other voltage-controlled oscillator 25.

A PLL circuit as shown in FIGS. 3A and 3B has the following advantages.

When the voltage-controlled oscillators 15 and 25 are fabricated on a single semiconductor chip of an integrated circuit, for example, not only the relative accuracy in characteristics of both oscillators can be easily improved but other circuit components can be easily integrated together therewith. Consequently, it becomes possible to fabricate a number of functional circuit units on a single semiconductor chip.

Figure 4:
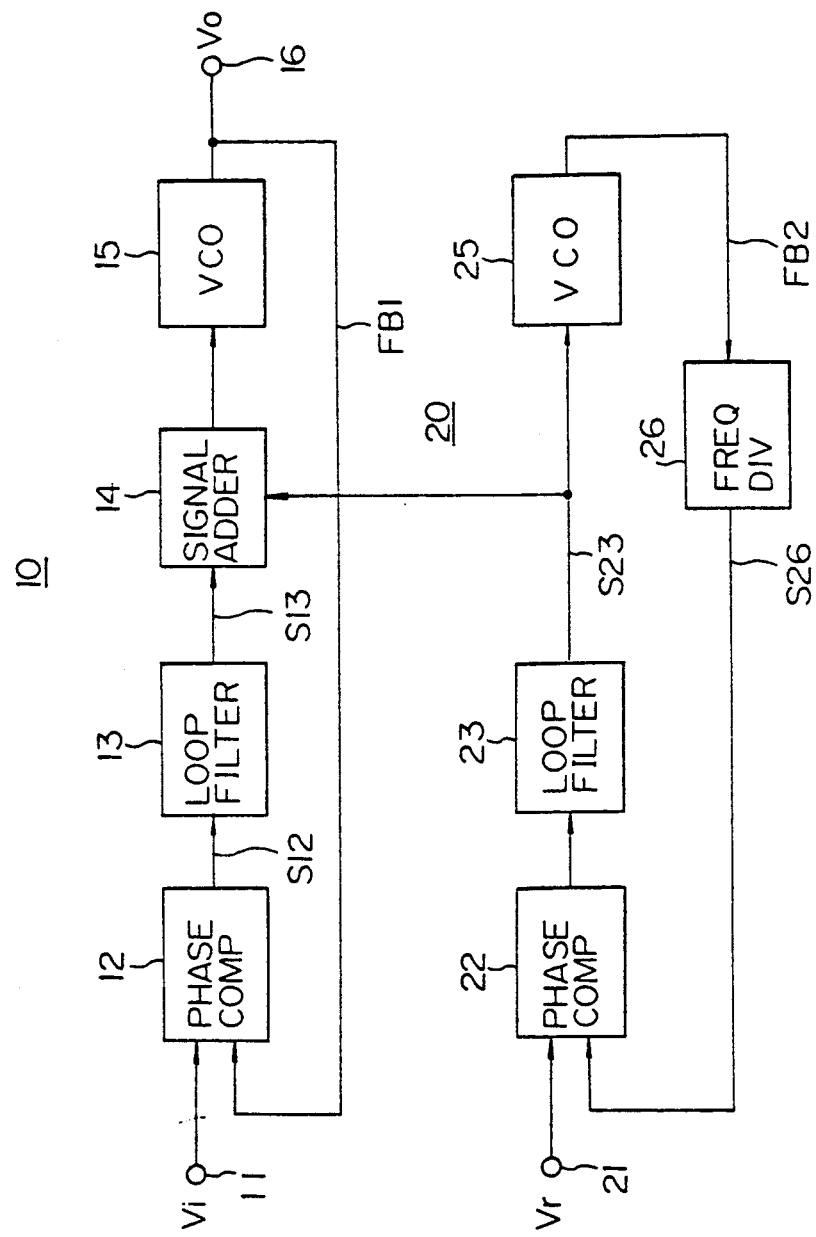
FIG. 4 is a schematic block diagram showing a configuration of an alternative embodiment of the PLL circuit in accordance with the present invention.

FIG. 4 is a circuit diagram showing a PLL circuit configuration of an alternative embodiment of the present invention, in which the same reference numerals are allotted to the elements which are similar to those shown in FIG. 1. In the PLL circuit, a frequency divider 26 is installed between the output of the voltage-controlled oscillator 25 and the input of the phase comparator 22 in the second phase-locked loop 20 shown in FIG. 1.

In response to the second feedback signal FB2 supplied to the divider 26, the frequency of the second feedback signal FB2 changes according to a division ratio previously set in the divider 26. The output signal S26 from the divider 26 is input into the input terminal of the phase comparator 22 to be subject to a phase comparison with the reference signal Vr by the phase comparator 22. Then, the PLL circuit operates in a fashion similar to that described above for the illustrative embodiment shown in FIG. 1.

In a PLL circuit shown in FIG. 1, when an output signal Vo having a certain frequency, for example, must be output the reference frequency of the reference signal Vr must be set to substantially the same frequency as that of the output signal Vo. Thus, it may sometimes be necessary to provide an oscillating circuit for a reference frequency outside of the PLL circuit. In the illustrative embodiment shown in FIG. 4, however, since the frequency divider 26 is incorporated into the PLL circuit, a reference frequency is available which is resultant from a division ratio previously set in the divider 26, which facilitates an oscillating circuit provided in the integrated circuit for other purposes to be used. This will improve the utilization of a reference frequency and make it possible to set a reference frequency in a wider range.

Furthermore, the present invention is not to be restricted by the illustrative embodiments and it can be modified in various ways including applications exemplified below.

(a) While the illustrative embodiments mentioned above use the voltage-controlled oscillators 15 and 25 as a variable frequency oscillator, a current-controlled type of oscillator may be used therefor.

(b) For the phase comparators 12 and 22 shown in FIGS. 3A and 3B, for example, a balanced chopper type circuit or a balanced modulation circuit, a phase comparison circuit using flip-flop circuits, and a phase frequency comparator may be used.

(c) For the divider 26 in the circuit shown in FIG. 4, a variable divider capable of varying a division ratio may be utilized. This will facilitate the setting of a reference frequency.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A phase-locked loop circuit comprising:
   a first phase comparator for receiving an input signal and for determining a phase difference between the input signal and a first frequency signal to produce a first phase difference signal indicative of the phase difference therebetween;
   a first loop filter connected to said first phase comparator for eliminating a high frequency component from the first phase difference signal;
   a second phase comparator for receiving a reference signal and for determining a phase difference between the reference signal and a feedback signal to produce a second phase difference signal indicative of the phase difference between the reference signal and the feedback signal;
   a second loop filter connected to said second phase comparator for eliminating a high frequency component from the second phase difference signal;
   a signal adder circuit connected to said first and second loop filters for adding outputs from said first and second loop filters;
   a first variable-frequency oscillator operative in response to said signal adder circuit for producing the first frequency signal as an output of said loop circuit at a first frequency associated with an output from said signal adder circuit;
   a second variable-frequency oscillator operative in response to said second loop filter for producing a second frequency signal at a second frequency associated with the output from said second loop filter; and
   a frequency divider connected to said second variable-frequency oscillator for dividing the second frequency of the second frequency signal to produce the feedback signal to said second phase comparator.

2. A phase locked loop circuit in accordance with claim 1, wherein said frequency divider comprises a variable frequency divider capable of changing its dividing ratio in accordance with signals input thereto.

3. A PLL circuit in accordance with claims 1 or 2, wherein said first variable frequency oscillator comprises a current-controlled oscillator which oscillates at a frequency in response to an output current from said first loop filter to develop the first frequency signal; said second variable frequency oscillator comprising a current-controlled oscillator which oscillates at a frequency in response to an output current from said second loop filter to develop the feedback signal.

4. A PLL circuit in accordance with claims 1 or 2, wherein each of said first and second phase comparators comprises a balanced chopper circuit.

5. A PLL circuit in accordance with claims 1 or 2, wherein each of said first and second phase comparators comprises a balanced modulator circuit.

6. A PLL circuit in accordance with claims 1 or 2, wherein each of said first and second phase comparators comprises a phase frequency comparison circuit which receives two input signals and determines a phase difference and a frequency difference thereof.

7. A PLL circuit in accordance with claim 1, wherein said first and second phase comparators, first and second loop filters, first and second variable frequency oscillators, signal adder circuit and frequency divider are formed on a single semiconductor chip.

8. A PLL circuit in accordance with claim 3, wherein each of said first and second phase comparators comprises a balanced chopper circuit.

9. A PLL circuit in accordance with claim 3, wherein each of said first and second phase comparators comprises a balanced modulator circuit.

10. A PLL circuit in accordance with claim 3, wherein each of said first and second phase comparators comprises a phase frequency comparison circuit which receives two input signals and determines a phase difference and a frequency difference thereof.

11. A phase locked loop circuit in accordance with claim 1, wherein said first phase comparator comprises an exclusive-OR gate having two input terminals for respectively receiving said external input signal and said first frequency signal;

wherein said second phase comparator comprises an exclusive-OR gate having two input terminals for respectively receiving said reference signal and said feedback signal;

wherein said first and second loop filters each comprises a low pass filter including a resistor and a capacitor;

wherein said signal adder circuit comprises two resistors, each resistor having first and second terminals, said respective first terminals receiving said outputs of said first and second loop filters, and an operational amplifier having an input terminal which is commonly connected to said second terminals of said two resistors;

wherein said first variable frequency oscillator comprises a multivibrator type voltage-controlled oscillator which is driven by said output of said first loop filter for producing said first frequency signal; and wherein said second variable frequency oscillator comprises a multivibrator type voltage-controlled oscillator which is driven by said output of said second loop filter for producing said feedback signal.

* * * * *